United States Patent [19]

Miley

[11] Patent Number: 5,156,996
[45] Date of Patent: Oct. 20, 1992

[54] METHOD FOR FORMING GOLD RIBBON CONNECTORS FOR MICROWAVE INTEGRATED CIRCUITS

[75] Inventor: Daniel J. Miley, Fort Wayne, Ind.
[73] Assignee: ITT Corporation, New York, N.Y.
[21] Appl. No.: 684,610
[22] Filed: Apr. 12, 1991
[51] Int. Cl.⁵ .................. H01L 21/283; H01L 21/44
[52] U.S. Cl. .................................... 437/182; 437/180; 437/246
[58] Field of Search ............. 437/182, 183, 245, 246, 437/180, 209; 357/67, 69

[56] References Cited

U.S. PATENT DOCUMENTS

| | | | |
|---|---|---|---|
| 3,747,202 | 7/1973 | Jordan | 437/182 |
| 3,795,043 | 3/1974 | Forlani | 437/209 |
| 3,952,404 | 4/1976 | Matunami | 357/69 |
| 3,997,963 | 12/1976 | Riseman | 437/182 |
| 4,011,144 | 3/1977 | Bachman | 437/182 |
| 4,022,641 | 5/1977 | Lindberg | 437/182 |
| 4,577,213 | 3/1986 | Bauhahn | 437/182 |

FOREIGN PATENT DOCUMENTS 53-30273  3/1978  Japan .................. 437/182

Primary Examiner—T. N. Quach
Attorney, Agent, or Firm—Arthur L. Plevy

[57] ABSTRACT

To fabricate a ribbon connector for microwave integrated circuit use, an as fired, unclad alumina substrate is coated with a thin film of gold applied by sputter metallization. The thin layer of gold is then built up to a required ribbon thickness by an electroplating process. The thicker layer of gold is then etched by means of standard gold etching techniques where dimensions of the formed ribbons are determined by the precision process of photo reduction and masking rather than cutting and shaping of parts. This process also provides a convenient way to store and transfer these specially shaped ribbons and is amenable to use in mass production environments.

18 Claims, 2 Drawing Sheets

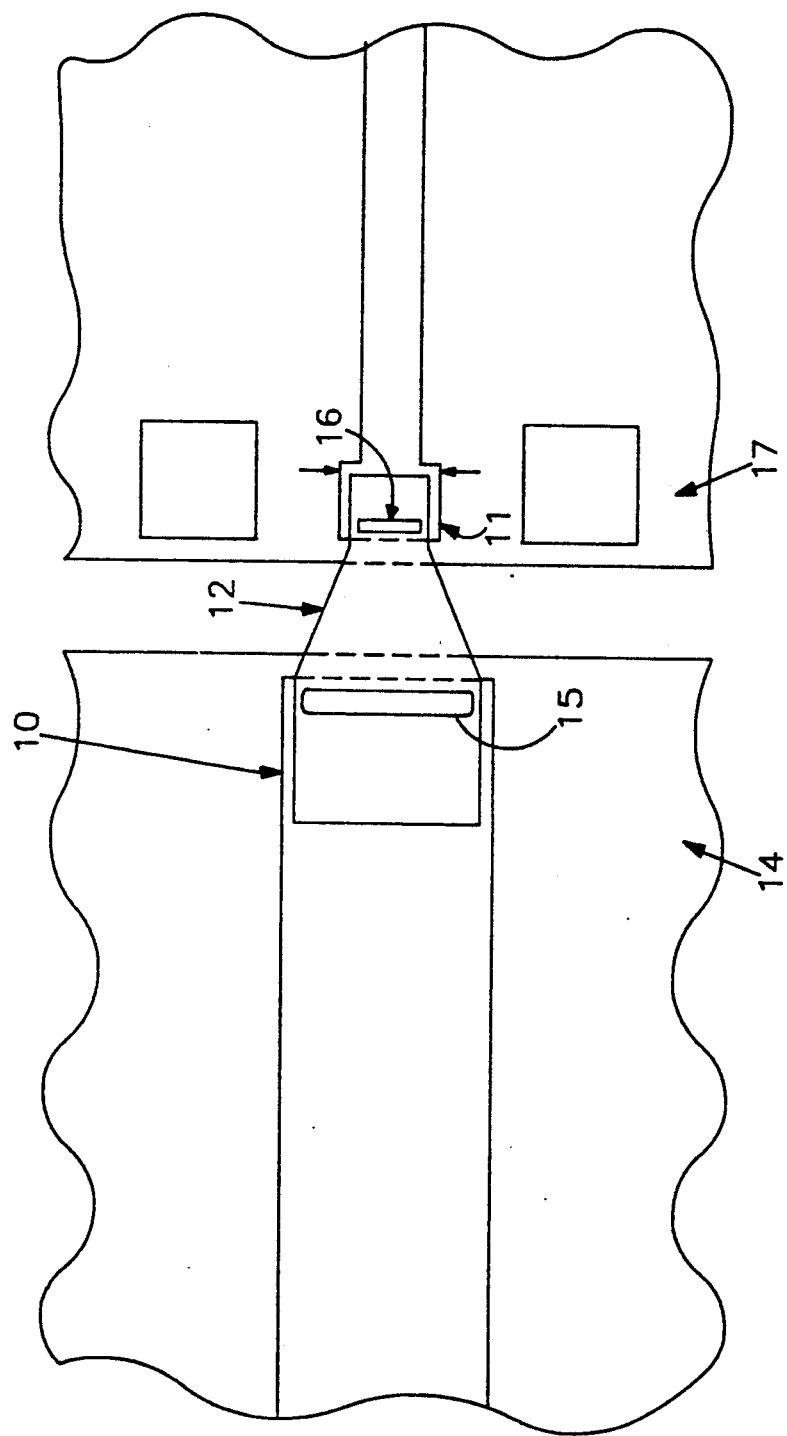

METHOD FOR FORMING GOLD RIBBON CONNECTORS FOR MICROWAVE INTEGRATED CIRCUITS

This invention relates to a method for forming a connector for a microwave integrated circuit and more particularly to a method for forming ribbon-like conductors fabricated from gold and employed for the interconnection of elements employed in microwave integrated circuits (MICs).

BACKGROUND OF THE INVENTION

For purposes of this disclosure, the microwave region of the electromagnetic spectrum shall be considered to span the frequency range from approximately 1 GHz to beyond 100 GHz. As one can ascertain, modern microwave circuitry employs integrated circuits which essentially operate within the above-noted frequency range. As is well known, ordinary components such as semiconductors, integrated circuits, lumped components, connecting wires, and so on act very differently at microwave frequencies. Such frequencies are so high that a connecting wire or ribbon behaves as a parasitic complex impedance that undesirably affects circuit operation. For example, in microwave integrated circuits which may employ silicon or gallium arsenide structures, thin gold wires are commonly used for making electrical connections between the MIC substrates and also from the MIC substrates of the integrated circuits to monolithic integrated circuit devices or other circuit elements. These gold wires are generally attached to the gold plated lines on the substrates and to the gold pads on the monolithic integrated circuit devices by means of thermo-compression bonding, thermosonic bonding, or by some form of a welding process. The impedance of these connections is a known parasitic that degrades the high frequency performance of the circuit. Multiple wire connections are commonly made to reduce the parasitic impedance, but such connections are of questionable reliability, difficult to inspect and virtually impossible to pull-test. Gold ribbons or meshes of given width and size are sometimes used to establish an effectively wider, lower impedance conductor. However, such materials are very difficult to cut to the microscopic lengths involved and offer no width variation along their length. These ribbons or meshes are attached by the same means as the gold wires. As one can ascertain, the parasitic connection impedance of a wire, or constant width ribbon or a mesh becomes a performance limitation for high frequency, high performance microwave systems. Thus in order to circumvent the problem associated with a single wire, multiple wire connections are employed. Hence a first pad or terminal is connected to a second pad or terminal by the use of a plurality of wires all electrically in parallel and operating to reduce the adverse parasitic effects. Multiple wire connections are difficult to fabricate, difficult to inspect, and are virtually impossible to sample pull-test. The sample pull-test evaluates the mechanical strength of the connection and must meet certain minimum requirements for high reliability applications. Constant width ribbons or meshes are restricted by the smallest pad size of the attachment land areas and these jumpers, such as ribbons or meshes, are difficult to cut to a proper length. It is, of course, understood that the greater the length the more resistance and the more parasitic inductance and capacitance. Techniques have been used to compensate for the reactive portion of a single wire's impedance. Such techniques involve the utilization of parallel capacitance which in conjunction with the wire or ribbon inductance form a low pass filter which has a pass band impedance of 50 Ohms. This technique does not minimize the resistive portion of the parasitic impedance and requires very tedious and careful installation such as available with numerically controlled wire bonding machines. Extensive calibration of the bonder is demanded before bonding, in order to tune the wire loop so that is properly resonates with the capacitance. At higher microwave frequencies, such as those frequencies at the nd of the above-noted range this technique tens to become unmanageable because the corner frequency of the LC filter moves into the pass band. Moreover, the single wire loop is a gross mismatch in a modal sense, and even if the parasitic impedance is deemed to be low, mode switching can occur at the transition and crate all types of seemingly anomalous behavior at the system level.

A common technique used to offset these problems is to use multiple wire bonding. This technique has only recently been approved by the military at microwave frequencies and such approval is available in present MIL standards only for the microwave frequency range. These multiple wire connections approach an optimal electric connection but are extremely difficult to fabricate, inspect, and test. Additionally, repair work which may require a second bonding to the pad ranges from very difficult to impossible depending on the geometries o the bonding area and the number of wires installed. The ribbon or mesh connections are constrained in width by the smallest pad size and are difficult to cut to length. Tearing off the ribbon after bonding is a questionable practice in that it compromises the integrity of the bond. In general it can be said that handling ribbon or mesh in production environments is impractical.

It is therefore an object of the present invention to provide a method for forming a ribbon which permits the construction of optimally-shaped microwave integrated circuit connecting ribbons which avoid the above-noted problems. It is also the object of this invention to provide an effective means for storing and installing these ribbons into a microwave integrated circuit.

SUMMARY OF THE INVENTION

A method of forming a ribbon conductor comprising the steps of sputtering gold (or by using other forms of thin-film deposition) on the surface of an as-fired alumina substrate to form a base layer, adding additional gold to increase the thickness of said thin-film layer to a desired value, coating with photoresist and exposing said metal layer to a photomask having the final shape of said ribbon, etching said exposed coated metal to produce said ribbon of said final shape, and removing said ribbon from said substrate. It is key to the utility of this method that the thin-film metallic layer and the substrate surface exhibit only mild adhesion sufficient to withstand the etching process, but weak enough to provide for later removal of the ribbons formed by the etching process. This is distinct contrast to standard plating techniques in which barrier metals other than gold are deposited first in order to achieve maximum adhesion to the substrate. These barrier metals are used as a base upon which to electro-form the thicker gold layer.

BRIEF DESCRIPTION OF THE FIGURES

FIG. 1 is a top plan view extremely enlarged of ribbon connector fabricated and installed according to this invention.

DETAILED DESCRIPTION O THE FIGURES

Figure 2A:
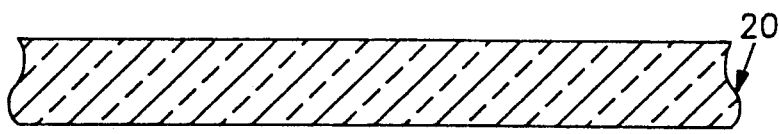
FIGS. 2a to 2e depict the steps utilized in the method for producing the ribbon connector as shown in FIG. 1.

Referring to FIG. 1 there is shown a top plan view depicting a microwave integrated circuit (MIC) fabricated with two typical substrates 14 (alumina) and 17 (gallium arsenide). Essentially microwave integrated circuits are well known. Reference numeral 10 refers to an RF distribution line which, for example, may be fabricated from gold. The shape of the terminal 10 is shown as rectangular but essentially any shape may suffice. Shown adjacent to the microwave integrated circuit 14 is another integrated circuit denoted by the reference numeral 17. The circuit 17 may also be a microwave integrated circuit or may be a monolithic integrated circuit also having a terminal 11 which may be a terminal pad or other connecting area. One objective of making connections in microwave integrated circuits is to bond as close to the edge of the terminal pads 10 and 11 so as to obtain a minimum length between the circuits. Hence, one desires to utilize the bonding technique to enable bonding to occur extremely close or directly at the edge of the terminal pad. As indicated, and as is well known in the art, there are many bonding techniques which can be employed such as thermocompression bonding, thermosonic bonding, as well as other bonding techniques. Located between the terminal pad 10 and terminal pad 11 is a tapered ribbon-like member 12. The tapered ribbon member 12 serves to make a connection between the circuits. As will be explained, the ribbon-like member 12 is fabricated from a highly conductive, non-corrosive metal such as gold. The gold member 12 as will be described is formed by integrated circuit techniques and serves to make the connection between the terminal pad 10 and the terminal pad 11. It is, of course, indicated that while the connection shown in FIG. 1 is afforded between a microwave integrated circuit 14 and a monolithic circuit 17 such a connector or ribbon member 12 can be utilized to make connections directly on a microwave integrated circuit substrate while achieving many of the advantages to be described herein. As will be explained, the formed ribbon concept employed by this technique allows the construction of optimumly-shaped MIC connecting gold ribbons of microscopic size. The ribbon 12 is shaped to match the width of the RF line or pads 10 and 11 at each end of the connection and to have a gradual taper in between the two ends. The ribbons are transferred to the installation location by means of tweezers or with the bonder tool tip and hence positioned to bridge the gap between the terminal pad or RF line 10 and the terminal 11. It is of course understood that both terminals 10 and 11 can be of the same size or of any other convenient size. The ribbon thickness is established to meet different requirements and for Ku-band operation (12 GHz to 18 GHz), they are fabricated to have 200 to 300 micro-inch thickness. These ribbons have been measured as having less than 1/7 the parasitic impedance of single 0.001 inch gold wire connections across a given gap. The soft gold composition and the short distances make these connections very compliant to thermally induced stresses and they will not experience creasing in thermal cycling. The ribbon shown in FIG. 1 is installed to bridge the gap between the end of a 50 Ohm line on a 0.010 inch thick alumina substrate designated by reference numeral 10 and 0.005 inch square bonding pad 11 of a GaAs monolithic microwave integrated circuit, MMIC. In order to utilize multiple bonding wires, it would require more than seven 0.001 inch thick wires bonded across the gap to achieve similar electrical performance to the formed ribbon connection. Utilizing seven wires, no total wire rebonding would be possible for these geometries. The formed ribbon 12 could be reworked several times and still have unused pad area available. For reference purposes the typical 0.001 inch diameter wire bond footprint is about 0.004 inches square. As will be explained and based on the method, the gold ribbons for such connections such as ribbon 12 of FIG. 1 are all shaped exactly alike and because such ribbons can be installed in a planar fashion, the very low parasitic impedance associated with the connection will also remain very constant from installation to installation. It is possible to shape the width transition region of the formed ribbon in such a manner as to effect an optimal medium transformation between the two elements of the assembly. Essentially this indicates that the formed ribbon transition will achieve the minimum parasitic impedance and minimum modal disruption possible over the distance allowed for the transition. As will be explained, the taper and shape of the ribbon 12 is produced by integrated circuit techniques whereby the exact configuration can be extremely closely held and provide extremely close tolerances as there is absolutely no machining or cutting necessary in order to produce such ribbons.

Referring to FIGS. 2a to 2e there is shown a series of steps employed in the method according to this invention. Essentially, the formed gold ribbons are fabricated through a variation of the conventional process used for making thin film microcircuits or alumina substrates.

As seen in FIG. 2a, unclad as fired alumina substrate 20 forms the basis to start of the fabrication process.

Figure 2B:
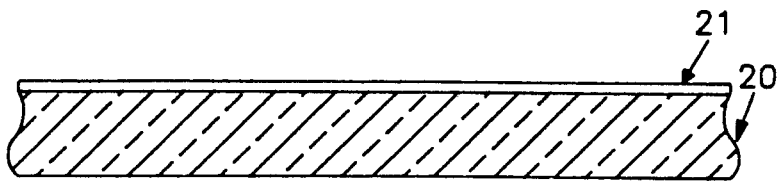

As shown in FIG. 2b, as fired, unclad alumina substrate 20 is coated with a thin film 21 of gold which is applied thereto by the use of sputter metallization. RF sputtering or other techniques can be used to coat the as fired surface of alumina with a thin layer of gold. It is key to this process that this layer of gold have only mild adhesion to the substrate surface.

Figure 2C:
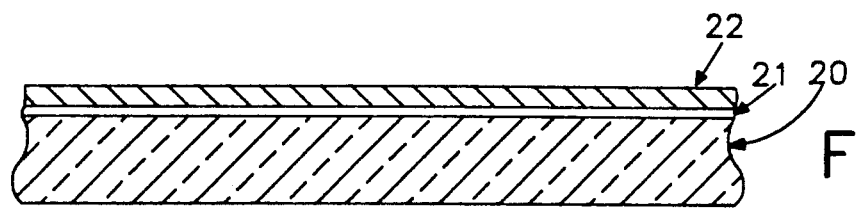

The next step in the process is shown in FIG. 2c whereby the layer of gold 21 is now built up to the required ribbon thickness by use of electroplating employing a conventional electroplating process. As described above for the Ku-band frequency range and above, the ribbon is typically 200 to 300 micro-inches thick. This thickness can be provided by electroplating the original sputtered layer 21 until the desired thickness is achieved. The quality of the ribbons formed depends on the quality of this layer and a slow, high density low defect layer must be created. The thickened sputtered layer 21 is then coated with a photoresist 22.

Figure 2D:
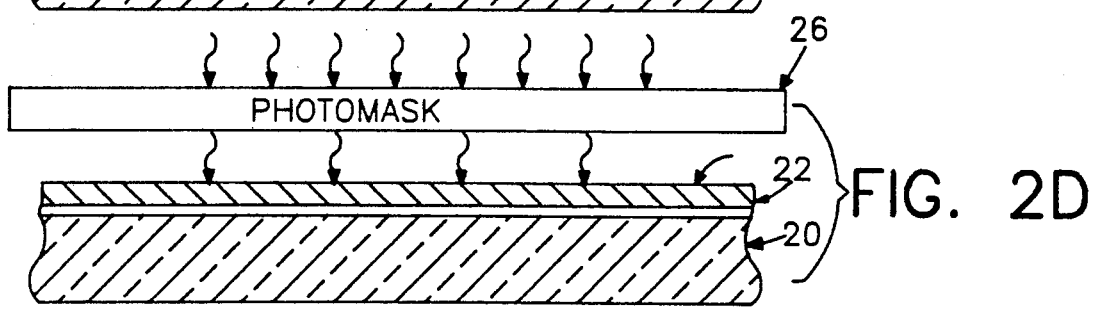
Figure 2E:
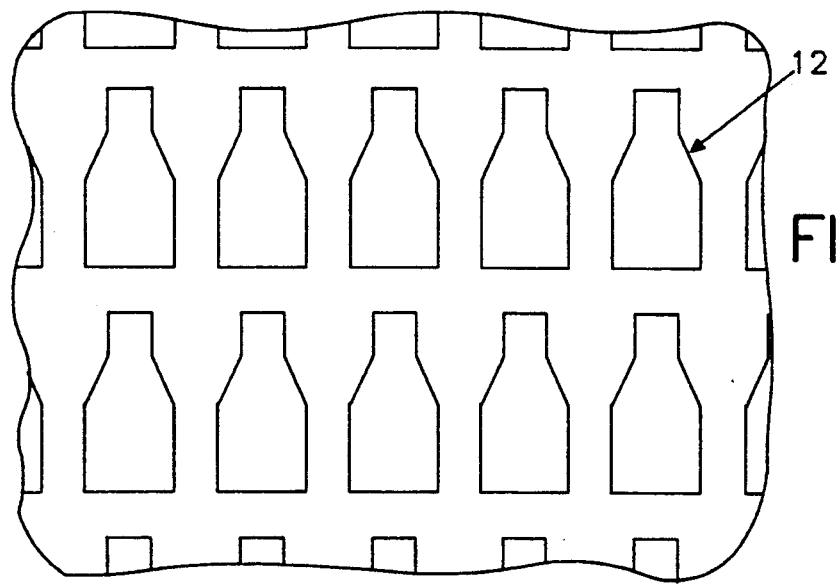

Next, referring to FIG. 2d a typical etch mask 26 is used. The mask is made by the precision process of photo reduction to provide the required ribbon profile. The photo reduction technique is widely employed in the integrated circuit field and any desired shape can be implemented. This mask is utilized to expose a conventional photoresist 22 on the gold layer to outline and firmly define the exact geometry of the thin ribbon. The gold as coated with exposed photoresist 22 is then etched by standard gold etching techniques as utilized in the fabrication of thin film MICs. Dimensions of the formed ribbons are determined by the precision process of photoreduction and masking rather than by cutting and shaping of the actual parts. As shown in FIG. 2e, by employing step and repeat procedures in the mask production, one can utilize these masks to fabricate multiple ribbon pieces on a single wafer such as 20. In this manner thousands of ribbons can be produced on a single 2"×2" alumina wafer or substrate. As one will ascertain from the above, the features which are pertinent in regard to this process is to apply the base metal gold by sputter metallization (or other surface film process) to provide a basis for the electroplated gold that can be built in thickness and will accurately determine the eventual ribbon thickness. The adhesion to the alumina substrate is intentionally designed to be weak. In this manner, the gold applied by means of sputtering provides sufficient stick to last through the photo masking and etching process but an insufficient stick so that the formed ribbons can be removed from the substrate by conventional mechanical means. For example, the formed ribbons are removed by applying a light pressure to the surface of the formed ribbon with a probe, for example a bonding tool tip, while simultaneously applying a slight pressure to an edge of the ribbon with a second probe. The ribbon so manipulated pops free of the surface but is restrained from flying away by the pressure of the first probe. In this manner the freed ribbon can then be transferred into position for bonding by means of tweezers or by the mechanical capture effect of the first probe digging into the soft gold. The positioned ribbon is then attached to the circuit metallized areas such as 10 and 11 of FIG. 1 by means of thermo-compression bonding, welding, of any suitable ribbon bonding technique. Such techniques are well known in the art. Thus the above-described method envisions formed ribbons which can be applied for high frequency, high performance interconnections of MIC circuit elements. Such ribbons can also be employed as tuning elements for lumped element circuits or in general where a precise, high Q, small value of inductance is required. The ribbons are ideal for fabricating many various microwave parts such as for building Lange couplers and as a single formed ribbon can be used to replace the multiple wires that are commonly used as jumper connections.

I claim:

1. A method of forming a ribbon conductor comprising the steps of:
   sputtering a conductive metal on the surface of an as fired substrate to form a removably adhered layer;
   coating said adhered layer with a photoresist material;
   masking said photoresist material with a photomask having the same profile as said ribbon;
   etching said adhered layer in areas not masked by said photomask to produce a final shape of said ribbon from said adhered layer on said substrate and
   removing said adhered layer providing said final shape of said ribbon from said substrate.

2. The method according to claim 1, wherein said conductive metal is gold.

3. The method according to claim 1, wherein said substrate is as fired alumina.

4. The method according to claim 1, wherein said ribbon is a planar member a first width at one end and a second smaller width at the other end thereby providing a tapered planar member.

5. The method according to claim 4, wherein the step of removing said ribbon from said substrate is lifting off said ribbon by applying pressure from a first probe to the surface of said planar member while applying pressure to the edge of said ribbon via a second probe to cause said ribbon the pop free of the surface while said first probe restrains said ribbon from flying away.

6. The method according to claim 1, further including the step of bonding one end of said ribbon to a first metallized pad and bonding said ribbon at said other end to a second metallized pad.

7. The method according to claim 6, wherein said first metallized pad is a gold pad located on a microwave integrated circuit.

8. The method according to claim 6, wherein said second metallized pad is a gold pad located on a monolithic integrated circuit.

9. A method of forming a ribbon conductor comprising the steps of:
   adhering a layer of conductive metal on the surface of an as fired substrate such that said layer can be selectively removed from said substrate;
   adding additional metal to increase the thickness of said layer to a desired value;
   coating said layer with a photoresist material;
   masking said photoresist material with a photomask having the same profile as said ribbon;
   etching said layer in areas not masked by said photomask to produce the final shape of said ribbon from said layer on said substrate; and
   removing said layer providing said final shape of said ribbon from said substrate.

10. The method according to claim 9, wherein said step of adding additional metal includes electroplating said layer to a desired thickness.

11. The method according to claim 10, wherein said thickness is between 200 to 300 micro inches.

12. The method according to claim 11, wherein said conductive metal is gold.

13. The method according to claim 12, wherein said substrate is as fired alumina.

14. A method of forming a ribbon conductor comprising the steps of:
   adhering a layer of conductive metal on the surface of an as fired substrate such that said layer can be selectively removed from said substrate; p1 adding additional metal to said layer, increasing said layer to a desired thickness;
   coating said layer with a photoresist layer;
   exposing said photoresist layer to a photomask having the final shape of said ribbon;
   etching said layer to produce said ribbon of said final shape on said substrate; and
   removing said layer providing said final shape of said ribbon from said substrate.

15. The method according to claim 14, wherein said conductive metal is gold.

16. The method according to claim 15, wherein said substrate is as fired alumina.

17. The method according to claim 15, wherein said step of adding additional metal includes electroplating said layer to said desired thickness.

18. The method according to claim 17, wherein said thickness is between 200 to 300 micro inches.

* * * * *

UNITED STATES PATENT AND TRADEMARK OFFICE
CERTIFICATE OF CORRECTION

PATENT NO. : 5,156,996
DATED : October 20, 1992
INVENTOR(S) : Daniel J. Miley

It is certified that error appears in the above-identified patent and that said Letters Patent is hereby corrected as shown below:

In Claim 14, column 6, line 49, delete "pl".

Signed and Sealed this

Twenty-eighth Day of September, 1993

Attest:

BRUCE LEHMAN

Attesting Officer        Commissioner of Patents and Trademarks